(12) United States Patent
Yamazaki et al.

(10) Patent No.: US 6,337,109 B1
(45) Date of Patent: *Jan. 8, 2002

(54) METHOD OF PRODUCING CRYSTALLINE SEMICONDUCTOR

(75) Inventors: Shunpei Yamazaki, Tokyo; Hisashi Ohtani, Kanagawa, both of (JP)

(73) Assignee: Semiconductor Energy Laboratory Co., Ltd., Kanagawa-Ken (JP)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 08/691,956

(22) Filed: Aug. 5, 1996

Related U.S. Application Data

(63) Continuation-in-part of application No. 08/487,166, filed on Jun. 7, 1995, now Pat. No. 5,656,825.

(30) Foreign Application Priority Data

Aug. 4, 1995 (JP) .............................................. 7-219531
Sep. 13, 1995 (JP) .............................................. 7-262592

(51) Int. Cl.$^7$ .............................. B05D 3/02; B05D 3/06; H01L 21/268

(52) U.S. Cl. ....................... 427/555; 427/554; 427/124; 427/125; 427/126.1; 427/383.3; 438/166; 438/486; 438/487

(58) Field of Search ................................. 427/553, 554, 427/555, 557, 558, 559, 582, 583, 584, 586, 250, 252, 124, 125, 126.1, 383.3, 376.2; 438/166, 486, 487, 488; 257/64, 65

(56) References Cited

U.S. PATENT DOCUMENTS

| | | | | |
|---|---|---|---|---|
| 3,967,001 A | * | 6/1976 | Almaula et al. | 427/252 |
| 4,309,225 A | * | 1/1982 | Fan et al. | 427/555 |
| 4,539,431 A | * | 9/1985 | Moddel et al. | 427/559 |
| 5,130,172 A | * | 7/1992 | Hicks et al. | 427/584 |
| 5,147,826 A | * | 9/1992 | Liu et al. | 437/233 |
| 5,275,851 A | * | 1/1994 | Fonash et al. | 427/578 |
| 5,492,843 A | * | 2/1996 | Adachi et al. | 438/166 |
| 5,529,937 A | * | 6/1996 | Zhang et al. | 437/10 |
| 5,543,352 A | * | 8/1996 | Ohtani et al. | 438/487 |
| 5,550,070 A | * | 8/1996 | Funai et al. | 438/166 |
| 5,569,610 A | * | 10/1996 | Zhang et al. | 437/21 |
| 5,619,044 A | * | 4/1997 | Makita et al. | 257/64 |
| 5,624,851 A | * | 4/1997 | Takayama et al. | 438/487 |
| 5,639,698 A | * | 6/1997 | Yamazuki et al. | 438/162 |
| 5,656,825 A | * | 8/1997 | Kusumoto et al. | 257/66 |
| 5,663,077 A | * | 9/1997 | Adachi et al. | 438/151 |
| 6,063,654 A | | 5/2000 | Ohtani | |

OTHER PUBLICATIONS

*Hackh's Chem. Dic.*, 3rd ed. J. Grant editor, McGraw–Hill Book Co., Inc, N.Y excerpts p. 270, 278, 405 414–415, 1944 no month.*

*The Condensed Chem. Dictionary*, 10$^{th}$ ed, G. Haroley, editor. Van Nostrand Reinhold Co., p. 342, 523, 536–excerpts, before 1985 (no month).*

* cited by examiner

Primary Examiner—Marianne Padgett
(74) Attorney, Agent, or Firm—Fish & Richardson, P.C.

(57) ABSTRACT

A method of producing a crystalline silicon film having superior crystalline properties is characterized by a method of adding catalytic metal for accelerating crystallization of the amorphous silicon film. The catalytic element is adsorbed on the surface of the amorphous silicon film by using a vapor or a gas, so that a low temperature short time crystallization is made possible by using the catalytic metal at heat crystallization. Especially, by controlling partial pressures, when adsorption state is made into monomolecular layer adsorption with covering rate 1, superior uniform crystalline silicon film can be obtained.

43 Claims, 10 Drawing Sheets

LASER LIGHT    LASER LIGHT

METHOD OF PRODUCING CRYSTALLINE SEMICONDUCTOR

This application is a continuation-in-part of application Ser. No. 08/487,166, filed Jun. 7, 1995, now U.S. Pat. No. 5,656,825.

BACKGROUND OF THE INVENTION

1. Field of the Invention

The present invention relates to a method of producing a crystalline silicon semiconductor film such as a polycrystal silicon film, a single crystal silicon film, and a fine crystal silicon film. The crystalline silicon films produced by using the present invention are used for various semiconductor devices.

2. Description of the Related Art

A thin film transistor (hereinafter referred to as TFT) using a thin film semiconductor is known. This transistor is constructed by using a thin film semiconductor, especially a silicon semiconductor film formed on a substrate. TFTs are used for various kinds of integrated circuits. Especially, they have attracted attention as switching elements provided for respective picture elements of an active matrix type liquid crystal display device, or driver elements formed on a peripheral circuit portion.

As a silicon film used for the TFT, it is simple to use an amorphous silicon film. However, it has a problem that the electric characteristics thereof are much lower than those of a single crystal semiconductor used for a semiconductor integrated circuit. Thus, it has been applied only for limited use in switching elements of an active matrix circuit and the like. The characteristics of the TFT can be improved by using a crystalline silicon thin film. The crystalline silicon other than the single crystal silicon is referred to as polycrystal silicon, polysilicon, fine crystal silicon or the like. Such a crystalline silicon film can be obtained by first forming an amorphous silicon film, and then crystallized by heating (thermal annealing). This method is referred to as a solid phase growth method since the amorphous state is transformed into the crystal state while keeping the solid state.

However, the solid phase growth of silicon requires a heating temperature of not less than 600° C. and a time of not less than 10 hours. Thus, there is a problem that it is difficult to use a cheap glass substrate as a substrate. For example, Corning 7059 glass used for an active type liquid crystal device has the glass distortion point of 593° C., so that a difficulty arises in performing thermal annealing of not less than 600° C., considering the enlargement of the area of a substrate.

According to the study of the present inventor(s) to solve such problems, it has been found that when a small amount of element such as nickel or palladium, or lead is deposited on the surface of an amorphous silicon film and then the film is heated, crystallization can be realized at 550° C. and in a processing time of about four hours.

A small amount of element (catalytic element for accelerating crystallization) can be introduced by depositing a coating film of the catalytic element or its compound by sputtering. However, if a large amount of the above-mentioned element is present in a semiconductor, the reliability and electrical stability of a device using such a semiconductor are damaged, which is not preferable. If a film is formed by sputtering, it has been difficult to precisely control the amount, that is, the thickness. Also, it has been further difficult to obtain a film having a uniform thickness on a substrate. Thus, the characteristics of the thus obtained semiconductor devices have not been uniform.

Further, when a film is formed by the sputtering, an amorphous silicon film is considerably damaged by the shock of sputtering, so that the characteristics of the thus obtained semiconductor devices are not necessarily satisfactory.

There is also a method of forming a coating film by means such as spin coating instead of the sputtering. However, the spin coating method presents the difficulty in obtaining a uniform coating film. For example, in a rectangular substrate such as in a liquid crystal display, a solution is apt to collect at corner so that the film thickness has not been uniform. Further, when the solvent drys to produce a coating film of a catalytic element compound, due to the unevenness of drying or generation of crystal nuclei, the film thickness becomes uneven, which causes uneven characteristics in semiconductor devices.

SUMMARY OF THE INVENTION

In the production of a crystalline thin film silicon semiconductor by heat treatment at a temperature lower than that required for a normal solid phase growth method using a catalytic element, an object of the present invention is to satisfy the requirements of (1) enabling the control of the trace of the catalytic element, and (2) enabling the uniform introduction of the catalytic element. Further, it is also an object of the invention to (3) improve productivity when the catalytic element is introduced.

In order to attain the above objects, according to the present invention, a vapor or a gas having a catalytic element is directly or indirectly adsorbed on the surface of an amorphous silicon film, and low temperature crystallization is carried out using the adsorbed catalytic element. The above structure of the invention has the following basic features.

(a) The concentration of a catalytic element in the amorphous silicon film is determined by the amount of the catalytic element adsorbed on the surface. The amount of the catalytic element adsorbed on the surface is set based on the ratio between an adsorbing speed of the catalytic element onto the surface and a separating speed from the surface. In case that the substrate temperature and total pressure are constant, the amount can be determined uniquely by a chemical potential of a vapor or a gas containing the catalytic element in vapor phase, (by a partial pressure in this invention).

(b) During the adsorbing step onto the surface, an extremely very uniform coating film is formed on the surface. By controlling a partial pressure of a vapor or a gas containing the catalytic element, it is possible to form three kinds of adsorbing layers, that is, a complete monomolecular adsorption layer (covering rate=1), a monomolecular adsorption layer with the covering rate of less than 1, and a multilayer absorption layer consisting of a plurality of molecular layers. Especially, in the region of the complete monomolecular adsorption layer, a wide plateau region is obtained with respect to a time change and a small partial pressure change, so that the control property is very high.

(c) Since only the adsorbing phenomenon is used, a film containing the catalytic element can be formed generally at a remarkably low energy, and the amorphous silicon film receives no damage as compared with other sputtering or evaporation method.

DETAILED DESCRIPTION OF THE INVENTION

Figure 1A:
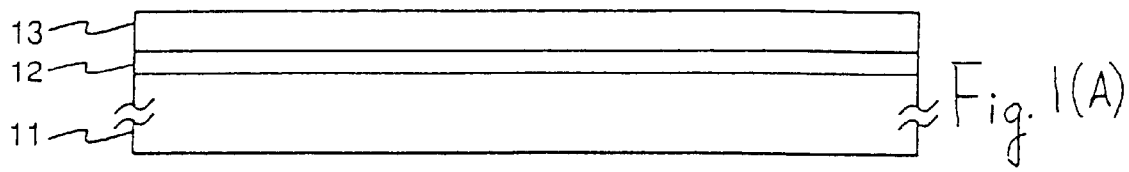
FIGS. 1(A) to 1(E) are views showing steps of adsorption of a monatomic layer according to the invention.
Figure 1B:
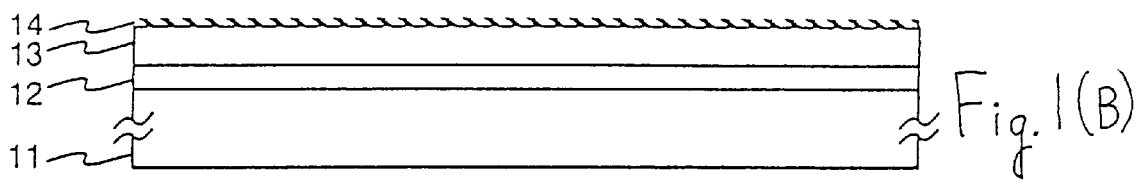

In the present invention, many compounds can be used for adding catalytic elements, which is one feature of the invention. For example, in the case where a group of soluble salt is selected, they are dissolved in pure water, and then bubbled by using a carrier gas such as argon to thereby being transferred into a chamber. The vapor pressure can be controlled by the temperature of a solution and the flow amount of the carrier gas. Also in the case of a compound which is soluble in an organic solvent, the similar method can be used.

In the case where a part of volatile salt and a group of organic metal are used, since these have low melting points, and they themselves have some degree of vapor pressure, the amount (partial pressure) of the catalytic element introduced into a chamber can be controlled by controlling heating temperature of these compounds. As examples of such organic metal materials, in the case where nickel is used as the catalytic element, there may be used Bis(cyclopentadienyl)nickel, $Ni(C_5H_5)_2$ (hereinafter referred to as BCP nickel or BCP salt), Bis-(methylcyclopentadienyl)nickel, $Ni(CH_3C_5H_4)_2$ (hereinafter referred to as BMCP nickel or BMCP salt), Bis(2,2,6,6-tetramethyl-3,5-(heptanediono)nickel, $Ni(C_{11}H_{19}O_2)_2$.

The BCP nickel has the melting point of 173 to 174° C., and the vapor pressures at 90° C. and 130° C. are 0.4 Torr and 0.6 Torr, respectively. BMCP nickel has the melting point of 34° C., and vapor pressures at 90° C. and 130° C. are 1.6 Torr and 15 torr, respectively.

A coating film obtained by adsorption of these organic metals may be directly deposited on an amorphous silicon film in a region to be introduced with a catalytic element. However, the surface of the amorphous silicon film is very active and easily oxidized. As a result, there is a problem that the surface state or adsorption state is apt to be uneven. In this case, on the contrary, a thin oxide film of not larger than 100 Å is first formed on the surface of the amorphous silicon film, and then the coating film may be deposited on the oxide film. This method is not limited to only organic metals, In the case where the catalytic element is introduced by bubbling of a solution, this method is also effective to obtain a uniform coating film with a small contact angle on the surface.

By selectively depositing a coating film of catalytic element or its compound, the crystal growth may be selectively carried out. For example, a mask film is selectively formed, and at only specified portions, the surface of the amorphous silicon film is substantially made exposed. The thickness required for the mask film is different depending on the material of the mask film. In the case of silicon oxide, a thickness of not less than 500 Å is sufficient. In some cases, it may be thinner. The film quality is more important rather than the film thickness. Since a step coverage is in a molecular level in the catalyst addition method using the absorption phenomenon of the invention, it demands attention lest the catalyst should easily reach the inside thereof due to the presence of pin holes or the like. Thus, it is necessary to notice the quality. Then, by depositing the coating film containing the catalytic element according to the present invention, the catalytic element is introduced into specified portions of the amorphous silicon film.

In this case, crystal growth can progress toward the region where the coating film of the catalytic element or its compound is not introduced, in the direction parallel to the surface of the silicon film from the region where the coating film is deposited. The region where the crystal growth is conducted in the direction parallel to the surface of the silicon film, will be referred to as a lateral crystal growth region in this specification.

In such a lateral crystal growth region, it is confirmed that the concentration of the catalytic element is low. As an active layer region of a semiconductor device, it is effective to utilize a crystalline silicon film. Generally speaking, however, it is more preferable that the concentration of the catalytic element in the active layer region is low. Thus, it is useful, in formation of a device, to form an active layer region of a semiconductor device using the lateral crystal growth region. However, a conventional adding method of catalytic element has such a drawback that a photolithography step must be carried out prior to the selective deposition of a coating film containing the catalytic element, so that the process becomes complicated. However, in the case where the organic metal compounds containing catalytic elements are used, these materials are easily decomposed by ultraviolet light. Therefore, ultraviolet light is irradiated only to a remaining portion of the monomolecular adsorption layer to thereby decompose such material. And then organic metal compound which was not decomposed is cleaned by an organic solvent, and it becomes possible to easily make the similar structure.

However, even if any of the above methods are used, since heat crystallizing step precedes the subsequent photolithography step (generally, formation of island), obstacles such as contraction of the substrate may possibly occur. Accordingly, it is necessary to consider such a problem in selecting the lateral crystal growth.

The present invention is generally embodied by the following steps.

(1) A substrate is placed in a chamber, and the temperature of the substrate is controlled to a predetermined value.

(2) A vapor or a gas containing a catalytic element for accelerating crystallization of an amorphous silicon film is introduced into the chamber and made to adsorb on the surface of the amorphous silicon film.

(3) If necessary, the catalytic element adsorbed on the surface of the amorphous silicon film is decomposed by heat or light so that a coating film of the catalytic element or its compound is formed on the substrate surface.

(4) The above amorphous silicon film is subjected to heat treatment thereby being crystallized.

Figure 9:
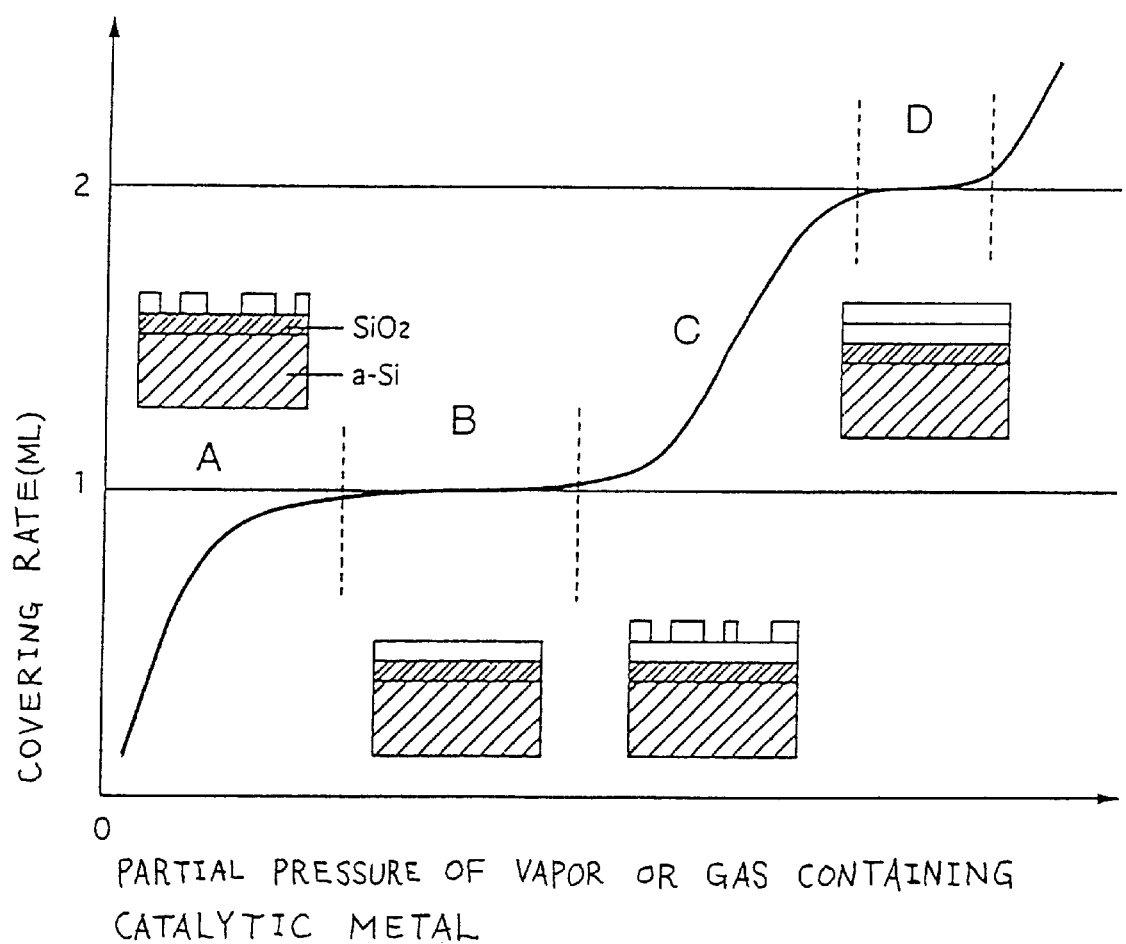
FIG. 9 is a view showing a model of an adsorption process of the invention.

Among these steps, step (2) will be described with reference to FIG. 9. The figure shows an example using such a sample that a silicon oxide film is formed on a glass substrate, an amorphous silicon film is formed thereon, and the surface of the amorphous silicon film is oxidized by about 10 Å by UV/ozone to improve a contact angle. The model of FIG. 9 is presumed from the relation between the partial pressure and the catalytic metal concentration after SPC. The unit (ML) of a vertical axis is a mono layer, that is, the unit means a monomolecular layer. A raw material is set in a chamber of a normal pressure or reduced pressure, then a vapor or a gas containing a catalytic metal is supplied. When the partial pressure of the vapor or gas is low, these molecules are partially adsorbed to the surface of a sample so that state (A) is obtained. This corresponds to a monomolecular adsorption layer with a covering rate of less than 1. As shown in FIG. 9, this state is sensible to the variation of partial pressures of the vapor or gas. Hence, this state is hard to secure the control.

Further, when the partial pressure is increased, region (B) is obtained, in which a compound containing the catalytic metal is uniformly adsorbed on the entire of the surface of the sample. This region corresponds to the complete monomolecular adsorption layer (covering rate=1), which is generally referred to as ALE window. Of course, all cases of adsorption do not become one as shown in FIG. 9. In this case, by oxidizing the surface of the sample by about 10 Å by the UV/ozone to improve the contact angle, such adsorption is made to occur easily. That is, as compared with the case where next molecules are adsorbed on the molecules once adsorbed, it is more advantageous that the molecules are adsorbed on an oxide film formed by the UV/ozone, in respect of energy. Thus, region (B) can be obtained over a relatively wide region. Further, in order to raise such monomolecular layer adsorption, migration on the molecular surface is inevitable. Thus, some extent of temperature is necessary.

However, only by the above described partial pressure control and temperature control, there is a case where the ALE window hardly exists. In this case, it may be necessary to contrive to make a state where only monatomic layer can be adsorbed by largely increasing the flow speed of the raw material gas. The thus obtained monomolecular adsorption layer is basically a kind of saturation region, so that it is not sensible to changes of partial pressure, changes of film growth (adsorption) time or the like. Thus, it has an advantage that a large margin can be taken.

When the partial pressure is further increased, the saturation property is broken, and next molecules start to be adsorbed to the molecules already adsorbed (state C). In the model of FIG. 9, when the partial pressure is further increased, the figure shows as if plateau region (D) with the covering rate of 2 again exists. However, this figure is absolutely based on a model, and in the second and subsequent layers, it appears that a fine plateau region as shown in FIG. 9 can not be obtained. This is because an energy difference is small between a case of uniform adsorption and a case of adsorption in vertical piling. Thus, a process margin is still large when region (B) is used in stead of region (D). If it is necessary to further deposit thick (that is, in case that the amount of addition of catalytic elements is required to be increased), it is preferable to repeat formation of region (B) several times with an intervening decomposition step of the adsorbed compound such as a heating step. Step (3) may be used also for this purpose.

The atmosphere in the above adsorption and decomposition steps may be in a reduced pressure or the atmospheric pressure. In the case of a reduced pressure, an apparatus having a structure such as in LPCVD may be used. In the case of the atmospheric pressure, an apparatus such as in APCVD (normal pressure CVD) may be used. However, these are determined by temperature and raw material. It may be suitable if a region where adsorption and re-separation are just balanced to take a wide ALE window, is used. However, in general, use of a reduced pressure apparatus is not desirable in view of. the throughput and cost. It is desirable to contrive the raw material and the temperature so that a wide ALE window can be taken in a region close to the atmospheric pressure.

Also, it is useful to react the catalytic element deposited during or after step (3) with the amorphous silicon at the interface to form a reaction product. If the product is previously formed, it is possible to more easily perform crystallization in the subsequent thermal crystallization step. Although this reason is not apparent, it is assumed that such product acts as crystallization nuclei.

With respect to step (4), after taking the substrate out of the chamber, the heat treatment may be carried out in another annealing apparatus. However, it may be carried out continuously in the same chamber.

After step (4), if irradiation of intense light such as laser light is carried out, it is possible to crystallize portions which were not completely crystallized by the solid phase growth. Thus, a crystalline silicon having more superior properties can be obtained. With respect to lasers to be used, various kinds of excimer lasers are easily used.

In the present invention, the most remarkable effects can be gained in the case where nickel is used as the catalytic element. As the kinds of other catalytic elements which can be used, Pd, Pt, Cu, Ag, Au, In, Sn, P, As, Sb may be preferably used. Also, a kind of or plural kinds of elements selected from VIII group elements, IIIb, IVb, and Vb elements can be made used.

Embodiment 1

In this embodiment, a crystalline silicon film is formed on the entire surface of a glass substrate. With reference to FIG. 1, steps from introduction of a catalytic element (nickel is used in this embodiment) to crystallization will be described. In this embodiment, Corning 7059 glass was used as a substrate. The size thereof is 100 mm×100 mm.

First, a silicon oxide film 12 was formed on a substrate 11 by a sputtering method or a plasma CVD method. The thickness of the silicon oxide film 12 was 1000 to 5000 Å, for example, 2000 Å.

Next, an amorphous silicon film 13 with a thickness of 100 to 1500 Å was formed by the plasma CVD method or LPCVD method. Here, the amorphous silicon film 13 with a thickness of 500 Å was formed by the plasma CVD method (FIG. 1(A)).

Figure 2:
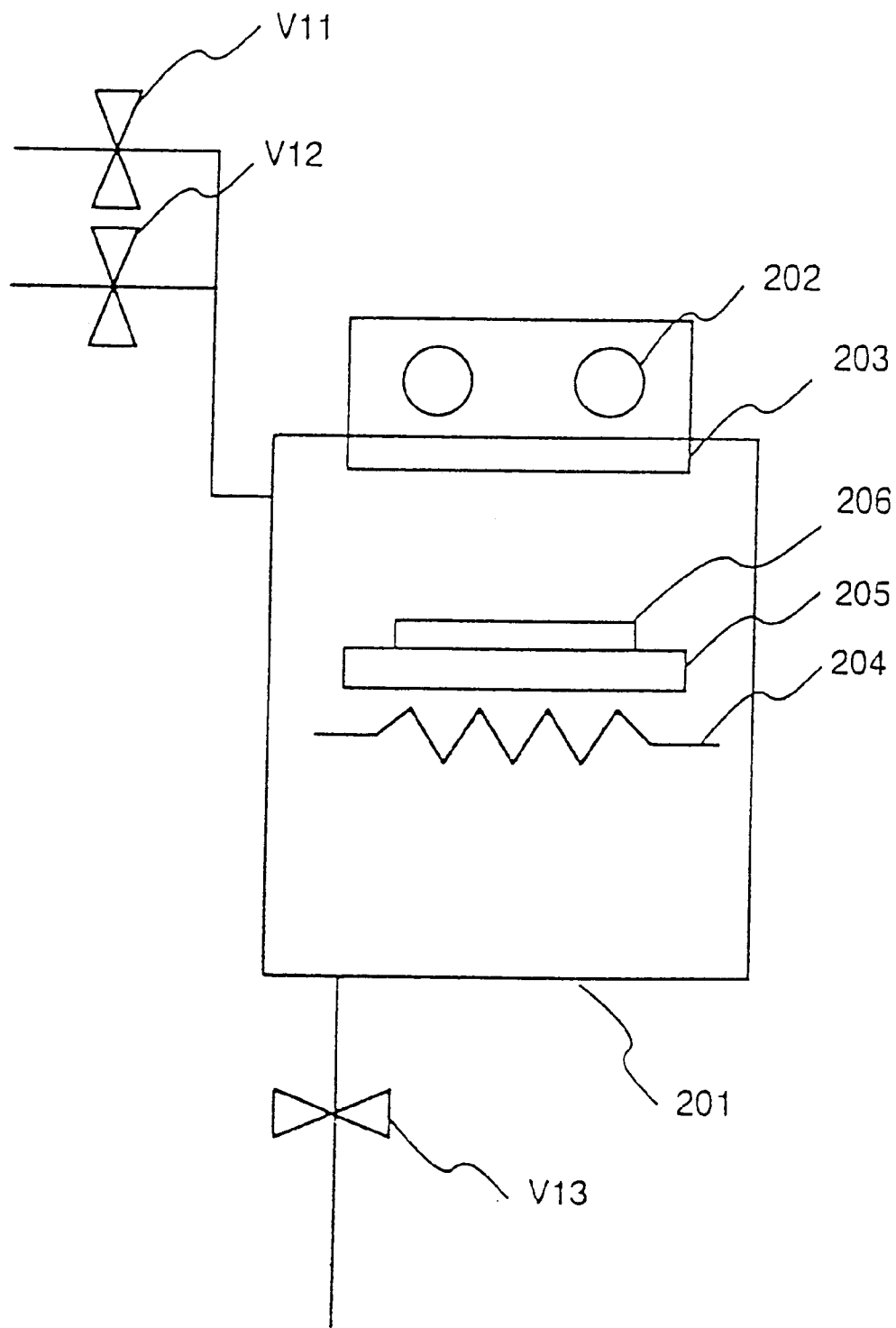
FIG. 2 is a view showing an apparatus used in steps of adsorption of a monomolecular layer.

Then, hydrofluoric acid treatment was carried out to remove stains and naturally oxidized films, and the substrate was set in a chamber 201 shown in FIG. 2. Here, chamber 201 will be briefly described. The chamber 201 is connected with a tube for introduction of a gas from the outside and a tube for exhaustion. The former has two lines. The first is a line for introducing an organic nickel gas/vapor, and the second is a line for a carrier gas. In the first line, the organic nickel gas/vapor (for example, BMCP nickel) generated from a vaporizer is transferred by a suitable gas (for example, hydrogen). At this time, in order not to solidify the organic nickel in a pipe, it is necessary to keep the pipe at a suitable temperature, preferably at a temperature equal to or higher than the vaporizer.

From the first gas line, the organic nickel gas/vapor can be obtained. It is difficult to control the concentration thereof to a necessary amount. That is, since the vapor pressure is determined by the temperature of the vaporizer, and the concentration is remarkably changed by a slight difference in the temperature. Then, from the second gas line, the carrier gas (for example, argon) is introduced to dilute the organic nickel gas/vapor. Also, this dilution is used to control the flow speed.

In this way, the organic nickel gas or vapor is introduced into the chamber 201. A substrate temperature control mechanism 204 controlled by a Peltier element is disposed in the chamber, and the substrate is set thereon. The substrate is heated up to such a temperature that the ALE window becomes largest in accordance with the material. In this embodiment, although it was not necessary to heat the substrate, the substrate temperature was controlled to be 25° C. in order to control the amount of adsorption.

Of course, it is desirable to keep the entire of the chamber at such a temperature that the organic nickel is not solidified.

A method of depositing a nickel film using the chamber of this structure will be described. First, the substrate is set, and then the inside of the chamber is exhausted to a suitable pressure. Since this step does not require very high vacuum, exhaustion of 1 to 500 mTorr is sufficient. Next, a current is flown into the substrate temperature control mechanism 204 to control the substrate at 25° C.

A valve V12 is opened in this state to flow argon so that the inside of the chamber is made to be a predetermined pressure. The flow amount of argon was 1SLM, and the reaction pressure was $1 \times 10^5$ Pa in this embodiment. Next, after confirming that a steady state is established at a predetermined pressure and temperature, the organic metal containing a catalytic metal element is introduced. In this embodiment, the BMCP nickel was used, and the flow amount was 100 sccm. A valve V11 is opened at the same time as the inflow of argon of the carrier gas, so that the organic metal gas impinges on the surface and is adsorbed on the surface of the amorphous silicon film. In the conditions of this embodiment, a partial pressure of BMCP nickel was about $3 \times 10^3$ Pa, so that monomolecular adsorption could be obtained (FIG. 1(B)).

Figure 1C:
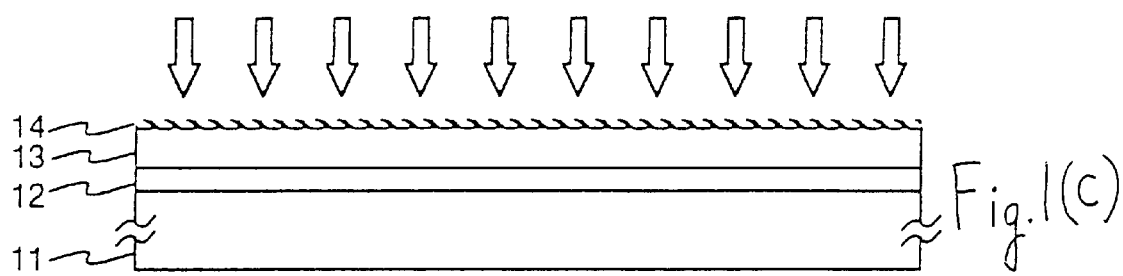
Figure 1D:
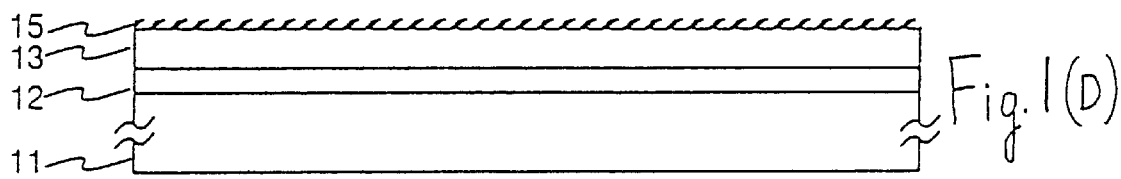
Figure 1E:
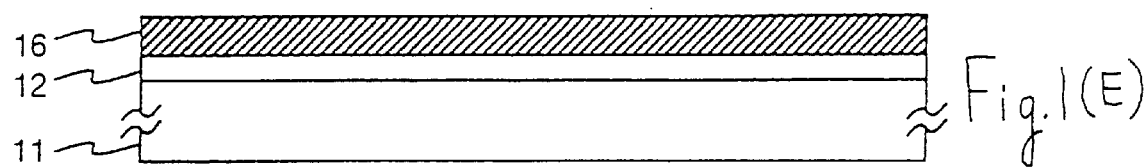

In synchronization with the impingement of the organic metal gas, light irradiation from a light source 202 is carried out onto the surface of the amorphous silicon film on which the organic metal molecules containing the catalytic metal element are adsorbed (FIG. 1(C)). The light source may be a laser, or other light source such as a xenon lamp, a halogen lamp, or low pressure and high pressure mercury lamps. This merely assists decomposition of the organic metal on the surface of the amorphous silicon film, so that the intensity of the light is not necessarily high. The significance of this light irradiation will be described.

In the case where the organic nickel metal gas is adsorbed onto the amorphous silicon film surface, the chamber is in the equilibrium state wherein the substrate temperature is 25° C. At the subsequent heat crystallization, the equilibrium is broken, and almost all the organic nickel metal gas is reseparated to escape into the gas phase. This is a problem caused since the BMCP nickel used in this embodiment is a material having the low melting point and high vapor pressure. The problem does not occur if soluble salt is used, and transferred and adsorbed by bubbling. Thus, this embodiment requires a step in which light irradiation (especially irradiation of ultraviolet rays) is carried out immediately after adsorption so as to decompose the adsorbed molecules so that these are transformed into compounds having low volatile properties. It should be noted that if the vapor or gas containing the catalytic metal continues to flow after the light irradiation, an adsorption step of a second layer proceeds, so that it is necessary to stop the gas flow synchronously with the light irradiation.

In this embodiment, a xenon lamp was used as a light source and made synchronous with the stop of gas impingement by using a shutter 203. Then, at every one sequence of gas impingement and light irradiation, Ni of almost monatomic layer could be adsorbed. In this way, a nickel compound film 14 is formed on the surface of the substrate (FIG. 1(D)).

Thereafter, a step of solid phase growth proceeds. The solid phase growth may be carried out in the same chamber in which the nickel compound film 14 was deposited. However, in general, the throughput is much lowered (due to sheet-fed type), it is suitable to take out into the outside and to carry out in a diffusion furnace or the like. In this embodiment, another vertical type furnace is used. The gas in the chamber is perfectly replaced with a gas harmless to a human body. Then, the chamber is opened to the air and the substrate is taken out. The subsequent solid phase growth step is similar to a conventional one.

At the solid phase growth, it is set that the substrate is heated to a temperature of 500 to 650° C. For example, when the Corning 7059 substrate is used, it is heated to 550° C. When the substrate is left as it is in this state, the solid phase growth proceeds. In the case where a Corning 1737 substrate is used as a substrate, it is possible to further raise the temperature so that crystallization at about 600° C. is made possible. In this way, even in the case where the temperature is raised, as compared with a conventional case where a catalytic metal is added, crystal growth is conducted in a very short time (about 24 hours in a conventional method is shortened to about 2 hours), so that a sufficient advantage can be obtained. In this way, a crystallized silicon film 15 could be obtained. As described above, although the above heat treatment can be carried out at a temperature not less than 450° C., if the temperature is low, a long heating time is required, which leads to a lowered productivity. Also, if it is heated not less than about 650° C., a problem of heat resistance of a glass substrate used as a substrate is revealed. Thus, the thermal annealing temperature must be determined taking the productivity and heat resistance of the substrate into consideration (FIG. 1(E)).

As in this embodiment, when the monomolecular layer absorption with the covering rate of about 1 is used, such a feature is found that the particle size in the obtained crystalline silicon film is uniform. Secco etching was performed and the particle size was measured in the mode of particle size estimate of AFM (made by Seiko Instruments Inc. SPI-3000). The average particle size was about 0.5 μm and the standard deviation (sigma) was not larger than 0.1 μm. On the other hand, when the film using region A where the covering rate is less than 1, was estimated, the average particle size was about 0.6 μm, and the standard deviation (sigma) was not less than 0.5 μm. That is, there was large unevenness. Also in the region C of multimolecular layer adsorption region, the average particle size was about 0.3

μm, and the standard deviation (sigma) was not less than 0.3 μm. That is, there was still unevenness. Thus, it was made apparent that the monomolecular layer adsorption of covering rate 1 was significant. In general, as a weak point of a TFT using a polycrystal silicon film, it is exemplified a phenomenon that the number of grain boundaries crossing a channel are greatly different for each element, which directly causes unevenness in element properties. On the other hand, in the case where the monomolecular adsorption of covering rate 1 is used as in the present invention, the number of these grain boundaries can be even, so that the uniformity of TFTs is improved to a large extent.

Embodiment 2

In this embodiment, hydrogen is used as a carrier gas when the monomolecular layer of nickel is formed on the amorphous silicon film 13 in embodiment 1.

A method of depositing a nickel film in this embodiment will be described. First, as shown in FIG. 2, a substrate is set, and the inside of a chamber is exhausted to a suitable pressure. A very high vacuum is not required in this step, so that the exhaustion of 1 to 500 mTorr is sufficient. Next, a current is flown into a substrate temperature control mechanism 204, so that the substrate is heated up to 350° C.

A valve V12 is opened in this state to flow the hydrogen gas, so that the inside of the chamber is made to be a predetermined pressure. The flow amount of hydrogen was 3SLM, and the reaction pressure was $1\times10^4$ Pa in this embodiment. Next, after confirming that a steady state is established at the predetermined pressure and temperature, an organic metal containing a catalytic metal element is introduced. In this embodiment, the BMCP nickel was used, and the flow amount thereof was 100 sccm. A valve V11 was opened for one second at the same time as the hydrogen of the carrier gas so that an organic metal gas was impinged on the surface and was adsorbed on the amorphous silicon film surface (FIG. 1(B)).

In synchronization with the impingement of the organic metal gas, light irradiation from the light source 202 is carried out to the amorphous silicon film surface on which the organic metal molecules were adsorbed (FIG. 1(C)).

In this embodiment, a xenon lamp was used as a light source, and using the shutter 203, the light irradiation was made synchronous with the gas impingement. Then, for every sequences of the gas impingement and light irradiation, Ni of almost monomolecular layer could be adsorbed. In the case where almost the same conditions as the above ones were used, and the BMCP nickel was used as the organic metal, it was found that a nickel layer formed in one sequence did not become a complete monatomic layer. It appears that this is a result that the covering rate was less than 1 because of large solid obstacles. In this way, a nickel compound film 14 is formed on the substrate surface (FIG. 1(D)).

Then, similarly to embodiment 1, the solid phase growth of the amorphous silicon film 13 may be carried out.

Embodiment 3

Figure 3:
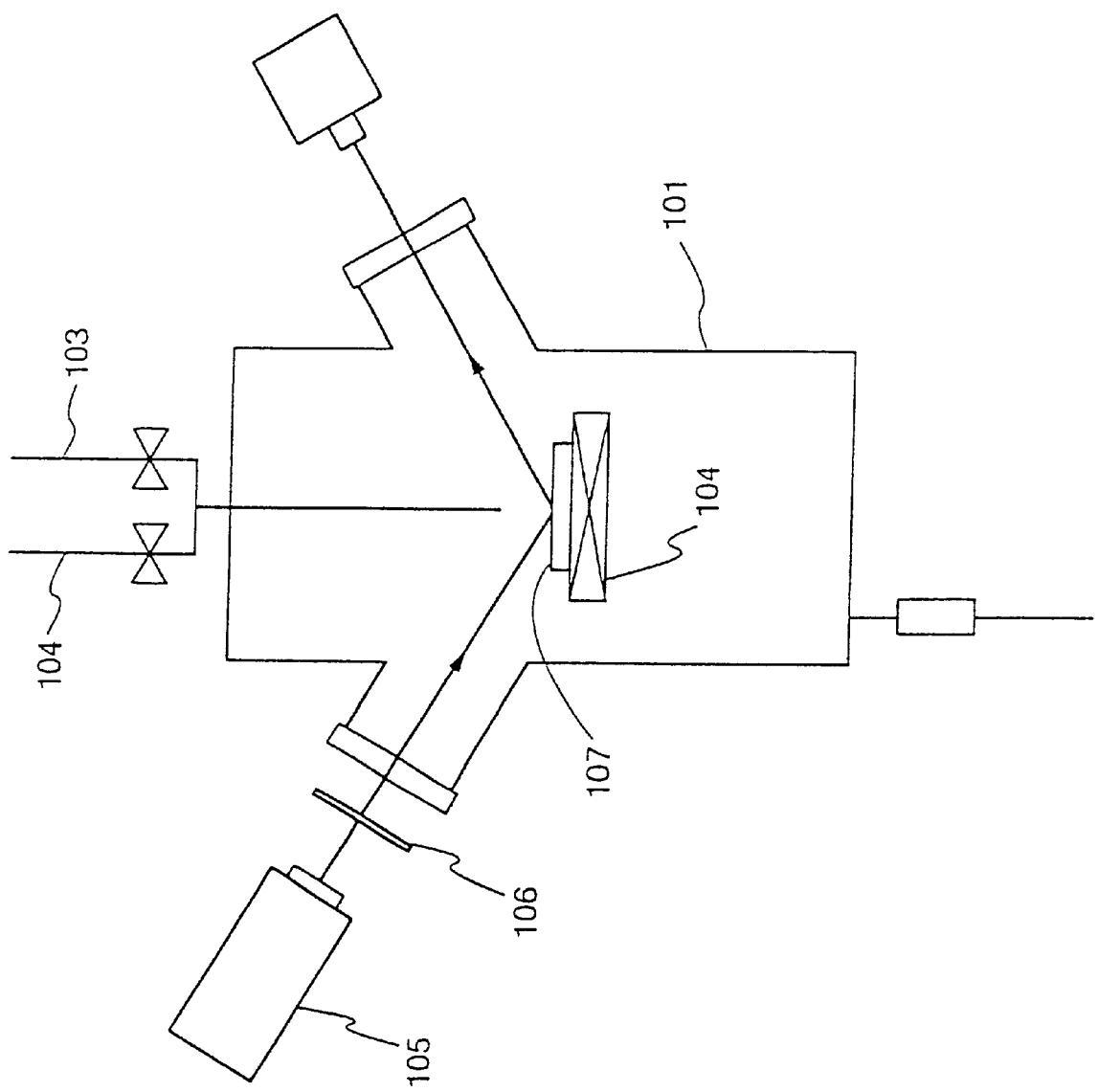
FIG. 3 is a view showing an apparatus used in steps of adsorption of a monomolecular layer.

In this embodiment, the similar raw material as in embodiment 1 is used, selective light irradiation is carried out, and nickel is added into only portions where light irradiation was carried out. With reference to FIG. 3, steps from introduction of a catalytic element (nickel is used in this embodiment) to crystallization will be described. Also in this embodiment, a Corning 1737 glass was used as a substrate. The size thereof is 100 mm×100 mm.

The steps from formation of an amorphous silicon film 13 on a substrate 11 to introduction thereof into a chamber 101 after removing a naturally oxidized film, are similar to those in embodiment 1. Thus, the description thereof will be omitted. Next, a portion where selective light irradiation is carried out will be described with reference to FIG. 3. After the substrate 11 is set in the chamber 101, by the similar operation as in embodiment 1, an organic nickel gas is introduced. When the organic nickel gas is introduced to reach the adsorption equilibrium, an argon gas laser 105 irradiates the substrate surface. Since the argon gas laser is a CW laser, the irradiation was made into pulse irradiation by using a shutter 106. Thereafter, only the carrier gas was flown for about 100 seconds, so that the organic nickel gas was removed from the atmosphere in the chamber. Next, the gas impingement and light irradiation were again carried out. Such a sequence was repeated about ten times, so that it was possible to form a nickel layer having a thickness of monatomic layer thickness×the number of times of sequences. Contrary to embodiment 1, film formation was repeated plural times to sufficiently carry out the lateral growth. In the portions where light irradiation was not carried out, since the decomposition of organic nickel on the surface hardly occurs, monomolecular layers are not piled, and a monomolecular layer finally remains as it is (since the partial pressure of the organic nickel gas does not become higher than that for monomolecular layer adsorption). Finally, while only the carrier gas was flown, the substrate temperature was raised, so that the remaining monomolecular adsorption layer was completely re-separated, whereby the nickel compound was deposited on only the portions where light irradiation was carried out.

A substrate temperature control mechanism 104 is disposed in the chamber, and a sample 107 is put thereon. This structure is same as that of embodiment 1. Of course, it is desirable that the entire of the chamber is kept at such a temperature that the organic nickel is not solidified.

Then, the solid phase growth proceeds. In this embodiment, since the substrate temperature is largely different from the substrate temperature necessary for thermal crystallization, it is not advantageous to carry out the step in the same chamber in view of throughput. Then, a method is adopted in which the substrate is taken out to the outside to carry out the solid phase growth step. In this case, the substrate temperature control mechanism 104 is turned off, the substrate is cooled, the inside is purged by nitrogen, and then the chamber is opened to the air to take out the substrate. Although the subsequent solid phase growth is almost similar to embodiment 1, in order to perform the lateral growth in this embodiment, the temperature was made to be 600° C. higher than embodiment 1 (it is possible since the Corning 1737 glass is used), and the time was four hours.

As a result, elliptical crystallization occurs only in the region where light irradiation was carried out, and the lateral growth region of about 100 μm around the region was observed. Crystallization was hardly observed in the further region, and it was confirmed that nickel could be selectively added.

Also, in this embodiment, hydrogen may be used as a carrier gas. In this case, an argon laser 105 irradiates the substrate surface synchronously with the introduction of the organic nickel gas. Then, only hydrogen is flown for about ten seconds, and then the gas impingement and light irradiation are carried out again. Such a sequence is repeated about ten times so that it is possible to strictly form a nickel layer having a thickness of monomolecular layer thickness× the number of times of sequences.

Embodiment 4

In this embodiment, after nickel is formed on the amorphous silicon film surface by a method shown in embodiment 1 or 2, nickel silicide is continuously formed on the surface, and then thermal crystallization is carried out.

Steps till decomposition and deposition of the organic nickel by a xenon lamp are same as those of embodiment 3, so that the description thereof will be omitted.

Thereafter, in order to purge the remaining gas in the inside, a valve V is opened to completely exhaust the organic nickel, and then nitrogen purge is carried out. Then, the temperature of the heater (substrate temperature control mechanism) 204 is raised in the state where the nitrogen is flown, up to a temperature of about 450° C. or more. Then, from nickel adsorbed as the monatomic layer and amorphous silicon, the nickel silicide is formed.

When a film on which the silicide is formed by the above step is compared with one on which the silicide is not formed as in embodiment 3, it is found that the density of nucleus generation at thermal crystallization is increased by the silicide formation through observation by an electron microscope.

Embodiment 5

In this embodiment, using a different raw material and method from embodiment 1 or 2, a crystalline silicon film is formed on the entire of a glass substrate. With reference to FIG. 4, steps from introduction of a catalytic element (nickel is used in this embodiment) to crystallization will be described. In this embodiment, Corning glass 7059 was used as a substrate. The size thereof is 100 mm×100 mm.

First, an oxide silicon film 12 was formed on a substrate 11 by a sputtering method or a plasma CVD method. The thickness of the silicon oxide film 12 was 1000 to 5000 Å, for example, 2000 Å.

Figure 4A:
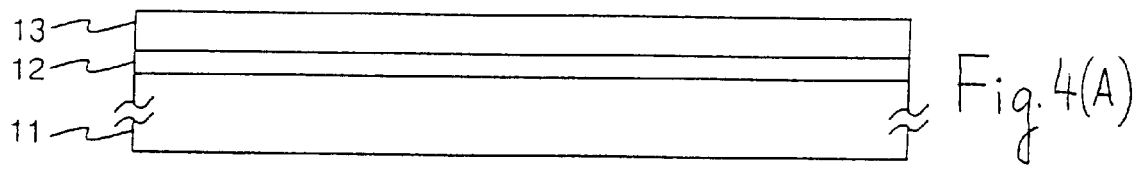
FIGS. 4(A) to 4(C) are views showing steps of adsorption of a monatomic layer according to the invention.
Figure 4B:
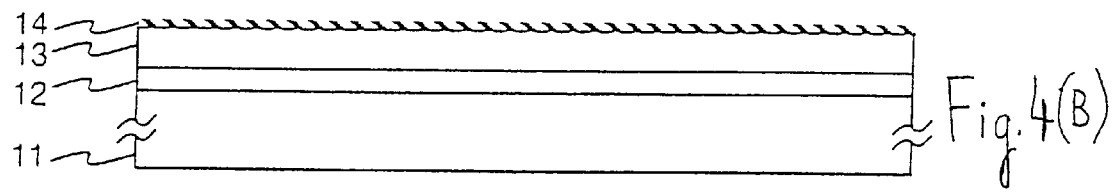
Figure 4C:
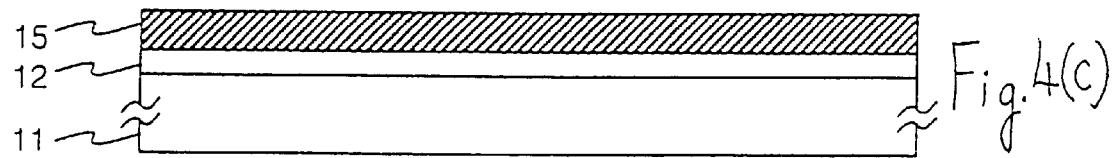

Next, an amorphous silicon film 13 with a thickness of 100 to 1500 Å was formed by the plasma CVD method or LPCVD method (FIG. 4(A)). In this embodiment, the amorphous silicon film 13 was formed with a thickness of 500 Å by the plasma CVD method.

Figure 10:
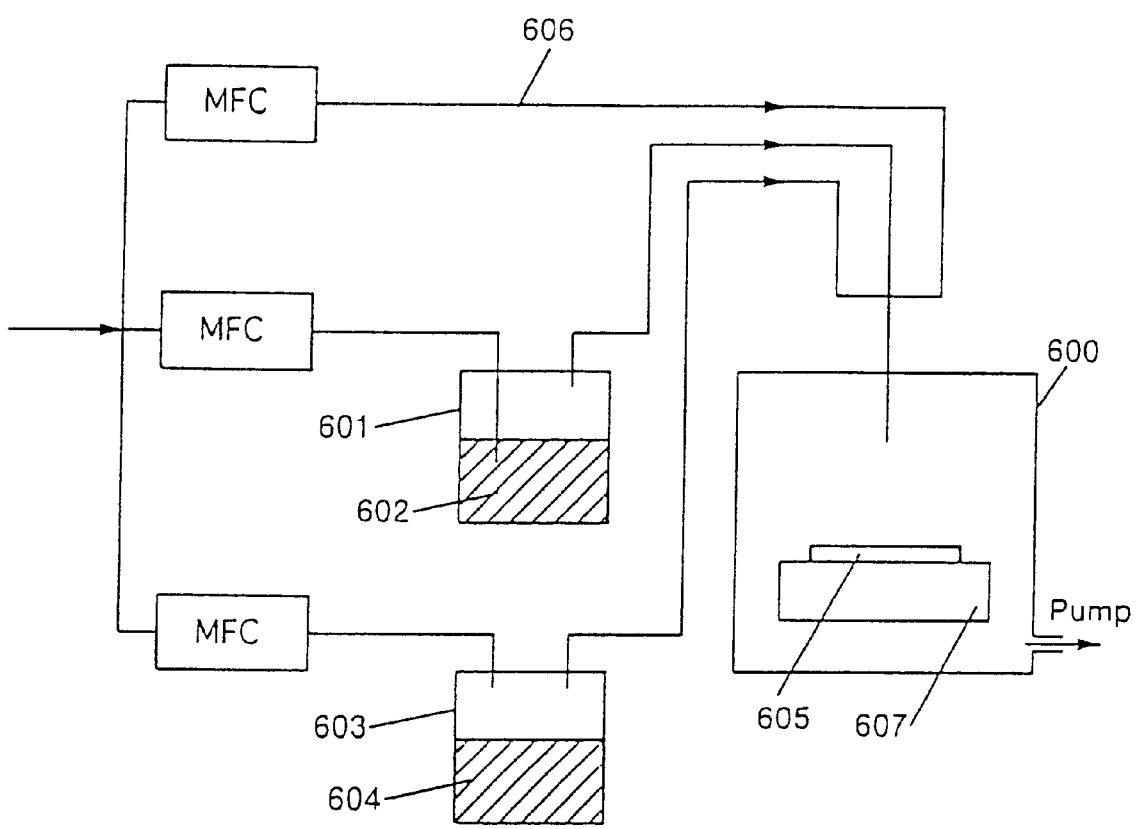
FIG. 10 is a view showing an apparatus used in steps of adsorption of a monomolecular layer according to the invention.

Then, in order to remove stains and naturally oxidized films, hydrofluoric acid treatment was carried out, and the substrate was set in a chamber 600 as shown in FIG. 10. Here, the chamber 600 will be briefly described. The chamber 600 is connected with a tube for introduction of a gas from the outside, and a tube for exhaustion. The former is formed of three lines. The first is a line for purge. Nitrogen, argon or the like is used as a gas. The second is a line for introducing a nickel vapor. A solution 602 containing dissolved nickel salt is put in a vaporizer 601 kept at a constant temperature, and by bubbling the carrier gas, the nickel salt is introduced into the chamber 600. The third is a line for introducing a water vapor. By controlling the partial pressures in the second line and the third line, the concentration of adsorbed nickel compound can be more finely controlled. The third line may be omitted as the case may be. Although not shown, the chamber is also constructed so that pipes are kept at a suitable temperature (not less than 100° C.) in order to prevent the water vapor from solidifying in the pipes.

This embodiment is similar to embodiment 1 and the like in that a substrate temperature control mechanism 607 controlled by a Peltier element is disposed in the chamber 600. A substrate 605 is placed thereon. The substrate is heated up to such a temperature that the ALE window becomes widest. Also in this embodiment, although it was not necessary to heat the substrate, the substrate temperature was controlled to be 50° C. in order to control the amount of adsorption.

Of course, it is desirable that the entire of the chamber is kept at a temperature so that the water vapor is not solidified.

A method of depositing a nickel film using the chamber 600 of this structure will be described. First, the substrate 605 is set. Then, the inside of the chamber 600 is exhausted to a suitable pressure. Since this step does not require very high vacuum, exhaustion of 1 to 500 m Torr is sufficient. Next, a current is flown into the substrate temperature control mechanism 607 to control the substrate at 50° C.

Argon is flown through the line 606 in this state, so that the inside of the chamber 600 is made to be a predetermined pressure. The flow amount of argon was 1SLM, and the reaction pressure was $5 \times 10^5$ Pa. Next, after confirming that a steady state at a predetermined pressure and temperature is established, a vapor containing nickel salt is introduced. In this embodiment, nickel nitrate salt (6N) was used, and the vapor was introduced using the solution 602 containing the dissolved salt of 1000 ppm. Further, the temperature of the vaporizers 601 and 604, and the flow amount of the carrier gas were adjusted, and adsorption was carried out under the condition that the ratio of the partial pressure of the water vapor containing nickel and the partial pressure of the water vapor containing no nickel was 1:1. It has been found from the subsequent SIMS analysis that this condition is in the region with the covering rate of less than 1. If the partial pressure of the water vapor containing nickel is further increased, it is possible to form the state where the covering rate is 1 (FIG. 4(B)).

In embodiment 1, there was a light irradiation step which might be called as a fixing step in some sense. However, since the inorganic salt used in this embodiment is a non-volatile material having the high melting point, such a step is not necessary.

Thereafter, the solid phase growth proceeds. Since the subsequent solid phase growth conditions and the like are similar to embodiment 1, the description thereof will be omitted (FIG. 4(C)).

Embodiment 6

In the manufacturing method of embodiment 1 or 2, a silicon oxide film with a thickness of 1200 Å is selectively provided, nickel is selectively introduced using this silicon oxide film as a mask, and the solid phase growth is carried out, in order that the lateral crystallization in accordance with this embodiment is carried out. FIG. 5 schematically shows manufacturing steps of this embodiment. First, a silicon oxide film 22 with a thickness of 1000 to 5000 Å was formed on a glass substrate (Corning 7059, 10 cm square) 21. Further, by the plasma CVD method or reduced pressure CVD method, an amorphous silicon film 23 with a thickness of 500 to 1000 Å was formed. Further, a silicon oxide film 24 as a mask film with a thickness of not less than 1000 Å, in this embodiment, 1200 Å was formed by the sputtering method. Although it was confirmed from the inventor's experiment that there was no problem even if the thickness of the silicon oxide film 24 was 500 Å, a further margin in the film thickness was provided in this embodiment (FIG. 5(A)) in order to prevent nickel from being introduced into unexpected portions by existence of pinholes or the like,.

Then, by normal photolithography patterning, the silicon oxide film 24 was patterned into a required pattern to form a window 25 for introduction of nickel. The thus processed substrate was set in the chamber 101 similarly to embodiment 1, and a nickel compound film 26 with a suitable thickness was deposited using the organic nickel gas (FIG. 5(B)).

Then, by heat treatment at 550° C. (in the nitrogen atmosphere) for 8 hours, crystallization of the amorphous silicon film 23 was carried out. At this time, crystallization first started at a portion 27 where the nickel compound film 26 was brought into close contact with the amorphous silicon film 23.

Figure 5A:
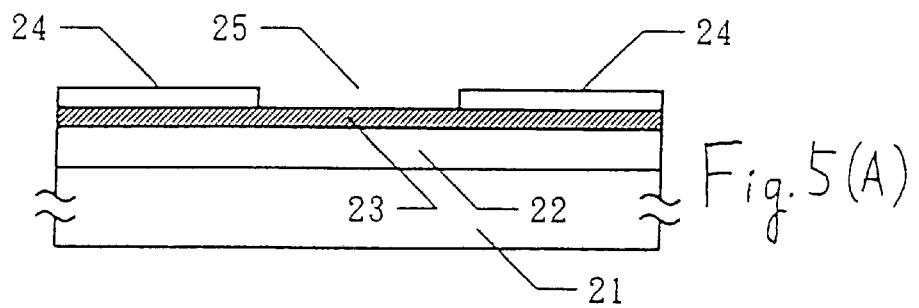
FIGS. 5(A) to 5(E) are views showing steps of a crystal growth method according to the invention.
Figure 5B:
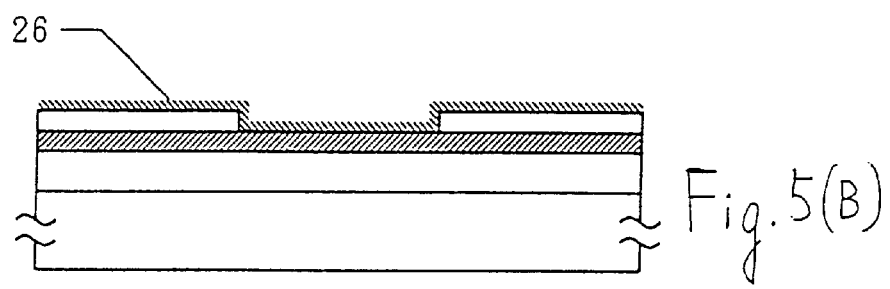
Figure 5C:
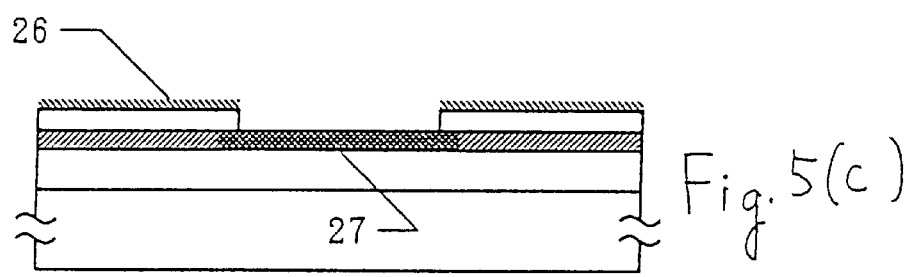
Figure 5D:
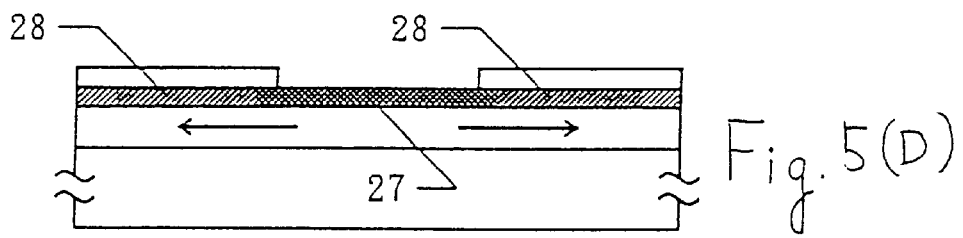

Then, crystallization progressed to the circumference as shown by arrows in the figure, and crystallization was carried out even in a region 28 which was covered with the mask film 24 (FIG. 5(D)).

Figure 5E:
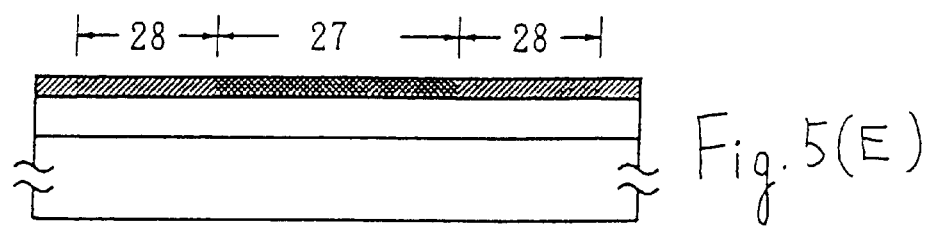

In this way, crystallization of the amorphous silicon film 23 was carried out. As shown in FIG. 5(E), in the case where the lateral crystallization is carried out as in this embodiment, three regions different in the properties are roughly obtained. The first is a region where the nickel compound film 26 was brought into close contact with the amorphous silicon film 23, a region indicated by reference numeral 27 in FIG. 5(E). This region is crystallized at the first stage of the thermal annealing step. This region will be referred to as a vertical growth region. In this region, the concentration of nickel is relatively high, and the direction in crystallization is not aligned. As a result, crystallinity of the silicon is not very good, so that the etching rate to hydrofluoric acid or other acid is relatively high.

The second is a region where the lateral crystallization was carried out, which is indicated by reference numeral 28 in FIG. 5(E). This region will be referred to as a lateral growth region. The direction of crystallization is uniform in this region, and the concentration of nickel is relatively low, so that the region is preferably available for the use in a device. The third is an amorphous region into which the lateral crystallization does not progress.

Embodiment 7

In this embodiment, the selective crystallization growth method shown in embodiment 3 is applied for embodiment 6. It is most remarkable difference from embodiment 6 that it is not necessary to form a mask made of silicon oxide film. FIG. 6 schematically shows manufacturing steps of this embodiment. First, a silicon oxide film 52 having a thickness of 1000 to 5000 Å was formed on a glass substrate (Corning glass 7059, 10 cm square) 51. Further, an amorphous silicon film 53 having a thickness of 500 to 1000 Å was formed by the plasma CVD method or reduced pressure CVD method (FIG. 5(A)).

Figure 6A:
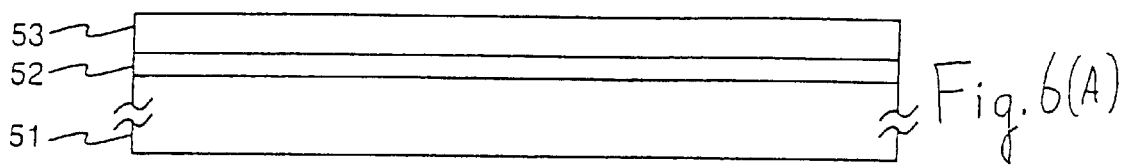
FIGS. 6(A) to 6(E) are views showing steps of a crystal growth method according to the invention.
Figure 6B:
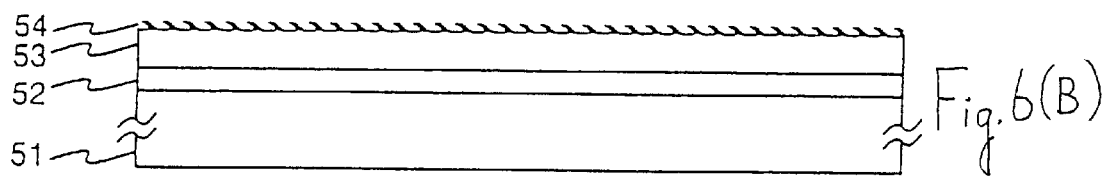
Figure 6C:
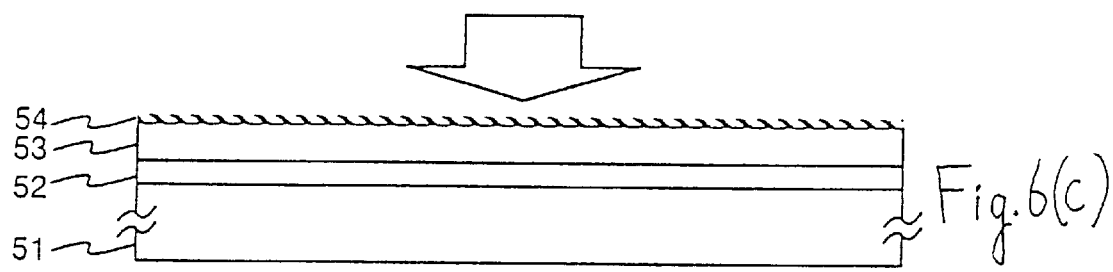
Figure 6D:
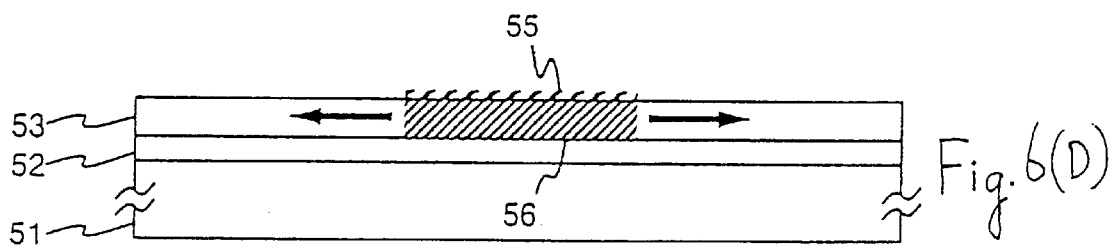

The above substrate is set in a chamber having almost the same structure as that used in embodiment 1, and in accordance with embodiment 1, organic metal 54 containing a catalytic metal element (nickel is used in this embodiment) is adsorbed (gentle adsorption without decomposition) on the amorphous silicon film surface (FIG. 6(B)). Next, in synchronization with this, light irradiation is carried out to only a region where addition of nickel is desirable (FIG. 6(C)). This is performed as follows.

A window is provided over the substrate set in the chamber. The window is designed so that a reticle on which a predetermined pattern is formed, can be set. Next, laser irradiation is carried out from the upper portion of this window and the reticle, so that light irradiation is carried out to only regions without a mask on the reticle. Since the distance between the reticle and the substrate is longer than a normal pattern gap, if a coherent light source is not used, the pattern formed becomes very blurred. Therefore, the laser is used. Of course, in order to improve this patterning precision, it is desirable that the window and the distance between the reticle and the substrate are made small. However, since the substrate is in the heated state, it is impossible to make this gap comparable to a stepper and the like. Thus, this method may be said to be suitable to form a relatively large pattern. As a result, it becomes possible to form a nickel film of monatomic layer or its compound film 55 on only the region which was irradiated with light. Of course, similarly to embodiment 3, it is important that the above sequence is repeated several times to adjust the addition amount of nickel (FIG. 6(D)).

By heat treatment at 550° C. (in nitrogen atmosphere) for 8 hours, the amorphous silicon film 53 was crystallized. At this time, crystallization first started at a region 56 where the nickel compound film 55 was brought into close contact with the amorphous silicon film 53 (FIG. 6(D)).

Thereafter, crystallization progressed into the circumference as shown by arrows in the figure. As a result, crystallization by the lateral growth was also carried out even in a region 57 where nickel was not deposited (FIG. 6(E).

Figure 6E:
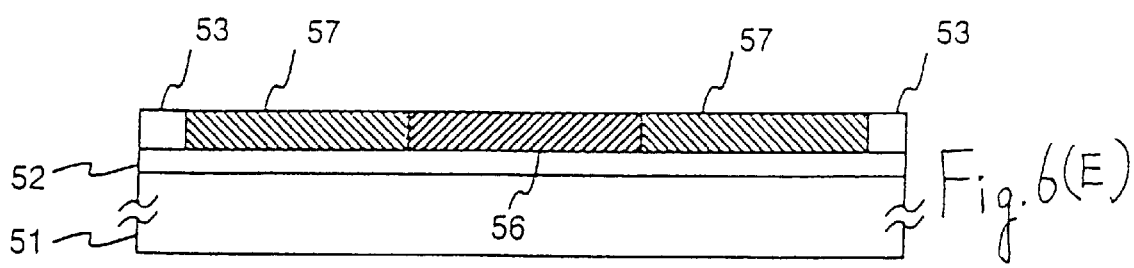

In this way, crystallization of the amorphous silicon film 53 was carried out. As shown in FIG. 6(E), in the case where the lateral crystallization is carried out as in this embodiment, three main regions different in the properties are obtained. The first is a region where the nickel compound film 55 was brought into close contact with the amorphous silicon film 53, which is indicated by reference numeral 56 in FIG. 6(E). This region is crystallized at the first stage of the thermal annealing step. This region will be referred to as a vertical growth region. In this region, the concentration of nickel is relatively high, and direction of crystallization is not uniform. As a result, crystallinity of the silicon is not excellent good, so that etching rate to hydrofluoric acid or other acid is relatively high.

The second is a region where the lateral crystallization was carried out, which is indicated by reference numeral 57 in FIG. 6(E)). This region will be referred to as a lateral growth region. In this region, the direction in crystallization is uniform, and the concentration of nickel is relatively low, so that the region is preferably used for a device. The third is a region where the lateral crystallization was not carried out.

Embodiment 8

In this embodiment, using a crystalline silicon film formed by the method of the present invention, a thin film transistor (TFT) is formed. FIG. 7 schematically shows manufacturing steps of this embodiment. First, a silicon oxide film 302 with a thickness of 2000 Å as an under layer was formed on a glass substrate 301. This silicon oxide film 302 was provided to prevent diffusion of impurities from the glass substrate. Then, an amorphous silicon film 303 with a thickness of 500 Å was formed by the similar method as embodiment 1 (FIG. 7(A)).

Figure 7A:
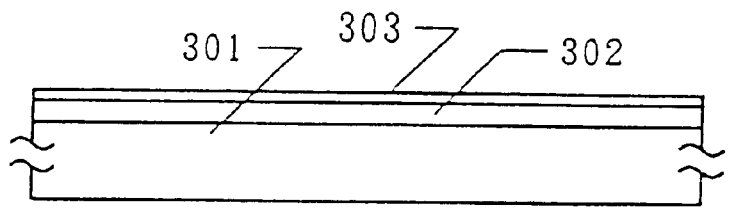
FIGS. 7(A) to 7(F) are views showing steps in the case where the invention is applied for TFT manufacturing steps.
Figure 7B:
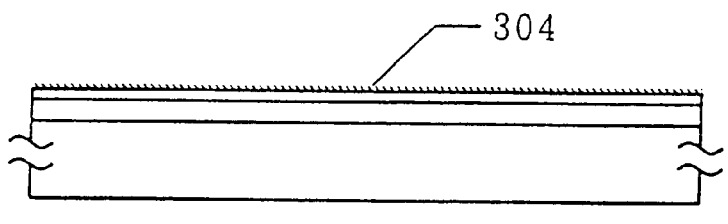
Figure 7C:
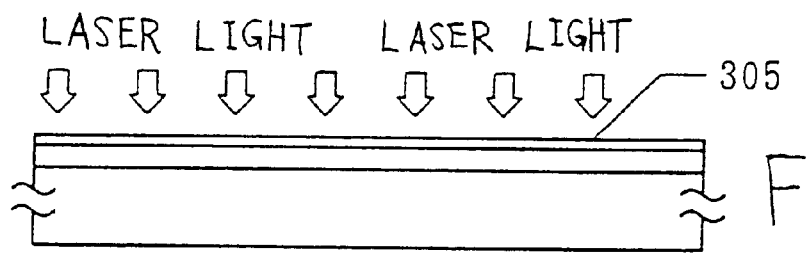
Figure 7D:
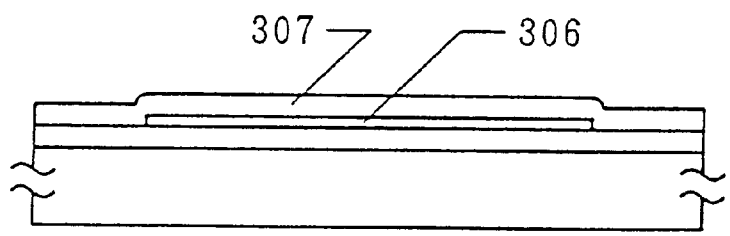
Figure 7E:
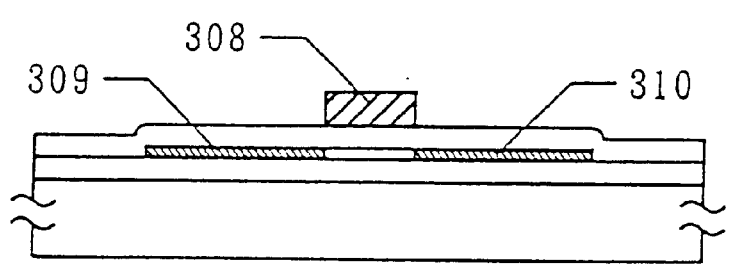
Figure 7F:
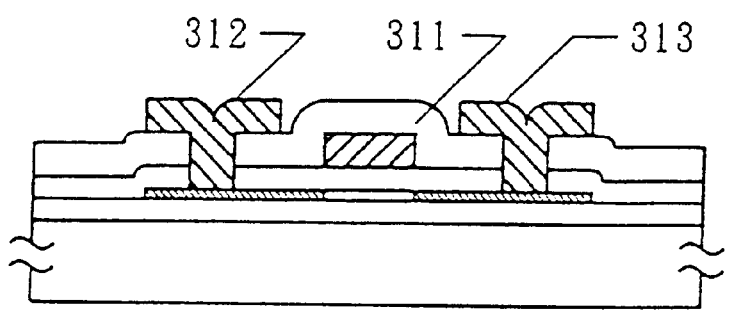
Figure 8A:
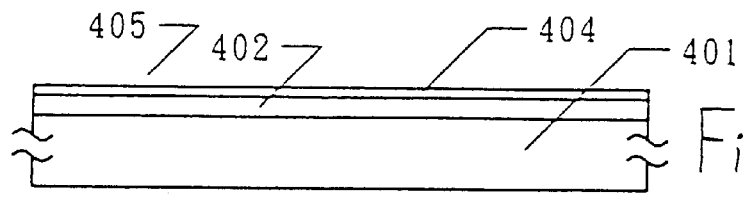
FIGS. 8(A) to 8(F) are views showing steps in the case where the invention is applied for TFT manufacturing steps.
Figure 8B:
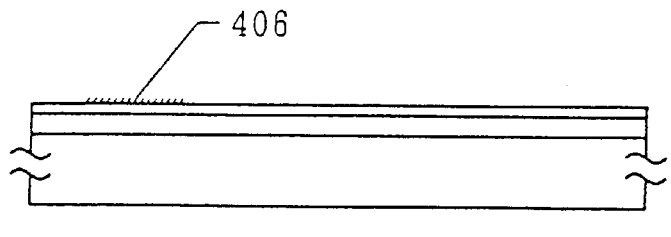
Figure 8C:
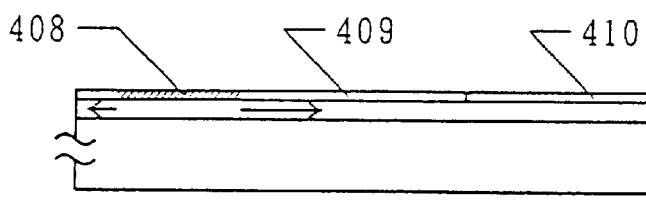
Figure 8D:
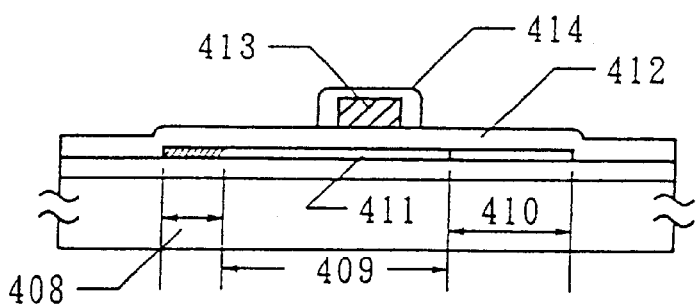
Figure 8E:
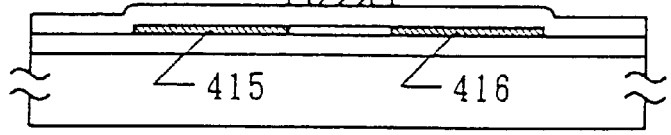
Figure 8F:
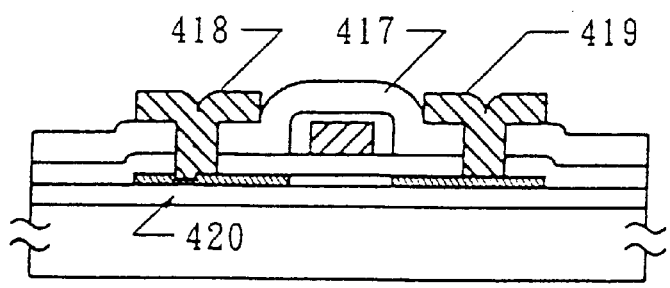

Then, similarly to embodiment 4, a nickel nitrate film 304 of monomolecular layer was adsorbed on the surface of the amorphous silicon film 303 by the similar method as embodiment 4 (FIG. 7(B)).

Then, by thermal annealing at temperature of 550° C. for four hours, the amorphous silicon film 303 was crystallized to form the crystalline silicon film 305. This silicon film was irradiated with KrF excimer laser light (wavelength 248 nm) to further improve crystallization. It was preferable that the energy density of the laser was 300 to 400 mJ/cm$_2$. In this way, in addition to crystallization by the solid phase growth, the laser light irradiation was carried out to further improve the crystallinity. This is because, as described also in embodiment 5, the direction of crystallization is not uniform at the portion where the nickel compound is brought into close contact with the amorphous silicon film, and crystal obtained by addition of nickel in this embodiment is needle crystal, so that a region where sufficient crystallization is not carried out by only the solid phase growth, is formed. Especially, a number of amorphous remainders were observed in the crystal grain boundaries. Then, it is desirable to completely crystallize such amorphous elements of the crystal grain boundaries by carrying out the laser irradiation (FIG. 7(C)).

Next, the crystallized silicon film was patterned to form an island region 306. This island region 306 constitutes an active layer of a TFT. Then, by the plasma CVD method, a silicon oxide film 307 having a thickness of 200 to 1500 Å, 1000 Å in this embodiment, was deposited. This silicon oxide film 307 also functions as a gate insulation film (FIG. 7(D)).

It is necessary to pay attention to formation of the above silicon oxide film 307. Here, TEOS was a raw material, which was decomposed and deposited together with oxygen by the RF plasma CVD method at substrate temperature of 150 to 600° C., preferably 300 to 450° C. The ratio of the pressure of TEOS and that of oxygen was 1:1 to 1:3, the pressure was 0.05 to 0.5 Torr, and the RF power was 100 to 250 W. Alternatively, the film was formed from a raw material of the TEOS together with an ozone gas by the low pressure CVD method or normal pressure CVD method at substrate temperature of 350 to 600° C., preferably 400 to 550° C. After formation of the film, annealing may be carried out at 400 to 600° C. for 30 to 60 minutes in the atmosphere of oxygen or ozone.

Then, a polycrystal silicon film having a thickness of 2000 Å to 1 $\mu$m and doped with phosphorus was formed by the low pressure CVD method, which was patterned to form a gate electrode 308. Thereafter, by an ion doping method (also referred to as a plasma doping method), impurities (phosphorus) were injected in a self alignment manner into the island silicon film of the TFT using the gate electrode as a mask. Phosphine ($PH_3$) was used as a doping gas. The dose amount was $1\times10^{14}$ to $4\times10^{15}$ $cm^{-2}$. In this way, N-type impurity (phosphorus) regions 309, 310 were formed (FIG. 7(E)).

Thereafter, as an interlayer insulator 311, a silicon oxide film with a thickness of 3000 to 8000 Å was formed by the plasma CVD method of a raw material of TEOS together with oxygen, or by the low pressure CVD method or normal pressure CVD method of the raw material together with ozone. The substrate temperature was 250 to 450° C., for example, 350° C. After film growth, in order to obtain the flatness of the surface, the silicon oxide film may be mechanically polished, or may be flattened by an etch back method. The interlayer insulator 311 was etched to form contact holes in the source/drain of the TFT, and wiring/electrodes 312, 313 of chromium or titanium nitride were formed.

Finally, annealing was carried out in hydrogen at a temperature of 300 to 400° C. for 0.1 to 2 hours to complete hydrogenating of the silicon. In this way, the TFT was completed. At the same time, a number of TFTs may be formed to arrange them in a matrix to form an integrated circuit for an active matrix type liquid crystal display device or the like (FIG. 7(F)).

Embodiment 9

This embodiment relates to steps of manufacturing a TFT. FIG. 8 schematically shows manufacturing steps of this embodiment. First, a silicon oxide film 402 with a thickness of 2000 Å as an under layer was formed on a glass substrate 401, and an amorphous silicon film 403 with a thickness of 500 Å was further formed thereon. A window 405 was selectively opened in a mask film 404 (FIG. 8(A)).

By the similar method as embodiment 4, a nickel nitrate film 406 was formed. In order to make adsorption easier, a thin oxide film was previously formed on the surface of the amorphous silicon film by ozone treatment (not shown) (FIG. 8(B)).

Thereafter, thermal annealing at 550° C. for 8 hours was carried out, so that the amorphous silicon film 403 was crystallized in the lateral direction as shown by arrows in the figure to form a vertical growth region 408 and a lateral growth region 409. The region which was not crystallized in this step remained as an amorphous region 410 (FIG. 8(C)).

As in this embodiment, in the lateral direction crystallization, crystallinity of the lateral growth region 409 is superior. Thus, even if crystallinity is not improved by irradiation of laser light or the like as in embodiment 6, a TFT can be formed, so that irradiation of laser light was not carried out in this embodiment. However, if the laser light irradiation is carried out, it is possible to obtain a TFT with better properties.

Next, the crystallized silicon film was patterned to form an island region 411. This island region 411 constitutes an active layer of the TFT. As is understood from the figure, this island region 411 includes the vertical growth region 408, the lateral growth region 409, and the amorphous region 410. In this embodiment, the lateral growth region 409 was made into a channel region of the TFT. This is because the channel region is an important region to determine the properties of the TFT.

Thereafter, a silicon oxide film 412 was deposited. This silicon oxide film 412 also functions as a gate insulation film. Subsequently, an aluminum film with a thickness of 2000 Å to 1 $\mu$m was formed by the sputtering method. This film was patterned to form a gate electrode 413. Aluminum may be doped with scandium (Sc) of 0.15 to 0.2 weight %. Then, the substrate was immersed in ethylene glycol solution of tartaric acid of 1 to 3% and pH=7, and anodic oxidation was carried out with a cathode of platinum and an anode of the gate electrode of this aluminum. The anodic oxidation was carried out in such a manner that a voltage was raised to 220V at a constant current at first, held for one hour at that state and the oxidation was ended. In this embodiment, in the constant current state, 2 to 5 V/minute of a raising speed of voltage is suitable. As a result, an anode oxide 414 with a thickness of 1500 to 3500 Å, for example, 2000 Å was formed on the upper surface and side surface of the gate electrode 413 (FIG. 8(D)).

Thereafter, by the ion doping method (also referred to as plasma doping method), impurities (phosphorus) were implanted in the island-like silicon film of the respective TFTs in a self alignment manner using the gate electrode as a mask. Phosphine ($PH_3$) was used as a doping gas. The dose amount was $1\times10^{14}$ to $4\times10^{15}$ $cm.^{-2}$. In this doping step, since the anode oxide 414 exists, the impurity regions 415, 416 and the gate electrode do not overlap with each other but are separated, that is, they are in a so-called off set state.

Thereafter, irradiation of a KrF excimer laser (wavelength 248 nm, pulse width 20 nsec) was carried out to improve crystallinity of the portion where crystallinity was degraded by the introduction of impurities. The energy density of laser was 150 to 400 $mJ/cm^2$, preferably 200 to 250 $mJ/cm^2$. In this way, N-type impurity regions (phosphorus) 415, 416 were formed. The sheet resistance of these region was 200 to 800 Ω/□. By the step of laser irradiation, the amorphous region 410 in the island-like region 411 was also crystallized (FIG. 8(E)).

Thereafter, a silicon oxide film 417 with a thickness of 5000 Å was deposited on the entire surface. Then, the silicon oxide film 417 was etched by a buffer hydrofluoric acid solution to form contact holes in source/drain of the TFT to form wiring/electrodes 418, 419 of polylayer film of titanium nitride and aluminum. In the etching step of the contact holes, among the island-like regions, since the vertical growth region 408 has a higher etching rate than the lateral growth region 409 and the amorphous region 410, a deep etched region 420 as shown in the figure was formed. As is apparent from this, if the entire of the contact hole is included in the vertical growth region, since there is a strong fear that contact fault occurs, it is desirable to design such that the contact hole extends into the region other than the vertical growth region. In this way, the TFT was completed (FIG. 8(F)).

As was described above, as an introduction method of catalytic elements for accelerating crystallization of an amorphous silicon film, a vapor or a gas containing the catalytic elements is used, and these are made adsorbed on the amorphous silicon film directly or through a very thin oxide film. Thus, the concentration of the catalytic elements is finely controlled, and uniform addition thereof can be made, so that uniformity of crystallization can be improved. Especially, in the adsorption steps, by using monomolecular layer adsorption, it is possible to particularly increase the uniformity, controllability, and reproduction property. As a result, it is possible to provide an electric device using a crystalline silicon film and having high reliability.

What is claimed is:

1. A method of producing a crystalline semiconductor comprising:
   adsorbing a material containing a catalytic element for accelerating crystallization of an amorphous silicon film in a continuous monomolecular layer with a covering rate of 1 onto a surface of said amorphous silicon film by using a vapor or a gas of an organic material containing the catalytic element; and
   crystallizing the amorphous silicon film by a heat treatment using the catalytic element.

2. The method of claim 1 wherein said catalytic element is Ni, Pd, Pt, Cu, Ag, Au, In, Sn, P, As, or Sb.

3. The method of claim 1 herein said catalytic element is selected from VIII group elements, IIIb, IVb, and Vb elements.

4. The method of claim 1, further comprising the step of patterning the crystallized silicon film to form at least a channel region of a thin-film transistor.

5. A method of producing a thin-film transistor comprising:
   forming an amorphous silicon film over a substrate;
   placing said substrate having said amorphous silicon film in a chamber;
   introducing into the chamber a vapor or a gas of an organic material containing at least one catalytic element for accelerating crystallization of the amorphous silicon film;
   exposing a surface of said amorphous silicon film to said vapor or gas of said organic material containing the catalytic element without decomposing said vapor or gas, such that said organic material is adsorbed by said surface;
   crystallizing the amorphous silicon film by a heat treatment using the catalytic element; and
   patterning the crystallized silicon film into at least one silicon island.

6. The method of claim 5 wherein said catalytic element is Ni, Pd, Pt, Cu, Ag, Au, In, Sn, P, As, or Sb.

7. The method of claim 5 wherein said catalytic element is selected from VIII group elements, IIIb, IVb, and Vb elements.

8. A method of producing a crystalline semiconductor comprising:
   placing a substrate having an amorphous silicon film in a chamber;
   introducing into the chamber a vapor or a gas of an organic material containing at least one catalytic element for accelerating crystallization of the amorphous silicon film;
   adsorbing the introduced vapor or gas of said organic material in a continuous monomolecular layer with a covering rate of 1 onto a surface of said amorphous silicon film; and
   crystallizing the amorphous silicon film by a heat treatment using the catalytic element.

9. The method of claim 8 wherein said catalytic element is Ni, Pd, Pt, Cu, Ag, Au, In, Sn, P, As, or Sb.

10. The method of claim 8 wherein said catalytic element is selected from VIII group elements, IIIb, IVb, and Vb elements.

11. The method of claim 8, further comprising the step of patterning the crystallized silicon film to form at least a channel region of a thin-film transistor.

12. A method of producing a crystalline semiconductor comprising:
    placing a substrate having an amorphous silicon film in a chamber;
    generating in a vaporizer a vapor or a gas of an organic material containing at least one catalytic element for accelerating crystallization of the amorphous silicon film;
    introducing the generated vapor or gas of said organic material into the chamber;
    adsorbing the introduced vapor or gas of said organic material in a continuous monomolecular layer with a covering rate of 1 onto a surface of said amorphous silicon film; and
    crystallizing the amorphous silicon film by a heat treatment using the catalytic element.

13. The method of claim 12 wherein said catalytic element is Ni, Pd, Pt, Cu, Ag, Au, In, Sn, P, As, or Sb.

14. The method of claim 12 wherein said catalytic element is selected from VIII group elements, IIIb, IVb, and Vb elements.

15. The method of claim 12, further comprising the step of patterning the crystallized silicon film to form at least a channel region of a thin-film transistor.

16. A method of producing a crystalline semiconductor comprising:
    placing a substrate having an amorphous silicon film in a chamber;
    introducing into the chamber a vapor or a gas of an organic material containing at least one catalytic element for accelerating crystallization of the amorphous silicon film;
    adsorbing the introduced vapor or gas of said organic material in a continuous monomolecular layer with a covering rate of 1 onto a surface of said amorphous silicon film; and decomposing at least a part of the adsorbed organic material; and crystallizing the amorphous silicon film by a heat treatment using the catalytic element.

17. The method of claim 16 wherein said catalytic element is Ni, Pd, Pt, Cu, Ag, Au, In, Sn, P, As, or Sb.

18. The method of claim 16 wherein said catalytic element is selected from VIII group elements, IIIb, IVb, and Vb elements.

19. The method of claim 16, further comprising the step of patterning the crystallized silicon film to form at least a channel region of a thin-film transistor.

20. The method according to claim 16, wherein said decomposing is conducted by a light irradiation.

21. A method of producing a crystalline semiconductor comprising:

placing a substrate having an amorphous silicon film in a chamber;

introducing into the chamber a vapor or a gas of an organic material containing at least one catalytic element for accelerating crystallization of the amorphous silicon film;

adsorbing the introduced vapor or gas of said organic material onto a surface of said amorphous silicon film; and decomposing at least a part of the adsorbed organic material; and crystallizing the amorphous silicon film a by heat treatment using the catalytic element.

22. The method of claim 21 wherein said catalytic element is Ni, Pd, Pt, Cu, Ag, Au, In, Sn, P, As, or Sb.

23. The method of claim 21 wherein said catalytic element is selected from VIII group elements, IIIb, IVb, and Vb elements.

24. The method of claim 21, further comprising the step of patterning the crystallized silicon film to form at least a channel region of a thin-film transistor.

25. The method according to claim 21, wherein said decomposing is conducted by a light heat.

26. A method of producing a crystalline semiconductor comprising:

placing a substrate having an amorphous silicon film in a chamber;

introducing into the chamber a vapor or a gas of an organic material containing at least one catalytic element for accelerating crystallization of the amorphous silicon film;

exposing a surface of said amorphous silicon film to said vapor or gas of said organic material containing the catalytic element without decomposing said vapor or gas so that said organic material is adsorbed onto said surface; and crystallizing the amorphous silicon film by a heat treatment using the catalytic element.

27. The method of claim 26 wherein said catalytic element is Ni, Pd, Pt, Cu, Ag, Au, In, Sn, P, As, or Sb.

28. The method of claim 26 wherein said catalytic element is selected from VIII group elements, IIIb, IVb, and Vb elements.

29. The method of claim 26, further comprising the step of patterning the crystallized silicon film to form at least a channel region of a thin-film transistor.

30. A method of producing a crystalline semiconductor comprising:

placing a substrate having an amorphous silicon film in a chamber;

generating in a vaporizer a vapor or a gas of an organic material containing at least one catalytic element for accelerating crystallization of the amorphous silicon film;

introducing the generated vapor or gas of said organic material into the chamber;

exposing a surface of said amorphous silicon film to said vapor or gas of said organic material containing the catalytic element without decomposing said vapor or gas so that said organic material is adsorbed onto said surface; and crystallizing the amorphous silicon film by a heat treatment using the catalytic element.

31. The method of claim 30 wherein said catalytic element is Ni, Pd, Pt, Cu, Ag, Au, In, Sn, P, As, or Sb.

32. The method of claim 30 wherein said catalytic element is selected from VIII group elements, IIIb, IVb, and Vb elements.

33. The method of claim 30, further comprising the step of patterning the crystallized silicon film to form at least a channel region of a thin-film transistor.

34. A method of producing a crystalline semiconductor comprising:

placing a substrate having an amorphous silicon film in a chamber;

introducing into the chamber a vapor or a gas of an organic material containing at least one catalytic element for accelerating crystallization of the amorphous silicon film;

exposing a surface of said amorphous silicon film to said vapor or gas of said organic material containing the catalytic element without decomposing said vapor or gas so that said organic material is adsorbed onto said surface;

decomposing at least a part of the adsorbed organic material; and crystallizing the amorphous silicon film by a heat treatment using the catalytic element.

35. The method of claim 34 wherein said catalytic element is Ni, Pd, Pt, Cu, Ag, Au, In, Sn, P, As, or Sb.

36. The method of claim 34 wherein said catalytic element is selected from VIII group elements, IIIb, IVb, and Vb elements.

37. The method of claim 34, further comprising the step of patterning the crystallized silicon film to form at least a channel region of a thin-film transistor.

38. The method according to claim 34, wherein said decomposing is conducted by a light irradiation.

39. A method of producing a crystalline semiconductor comprising:

placing a substrate having an amorphous silicon film in a chamber;

introducing into the chamber a vapor or a gas of an organic material containing at least one catalytic element for accelerating crystallization of the amorphous silicon film;

adsorbing the introduced vapor or gas of said organic material onto a surface of said amorphous silicon film;

supplying an energy to the adsorbed organic material to decompose said organic material;

stopping the supply of said energy wherein said gas or vapor is not introduced after stopping the supply of said energy; and crystallizing the amorphous silicon film by a heat treatment using the catalytic element.

40. The method of claim 39 wherein said catalytic element is Ni, Pd, Pt, Cu, Ag, Au, In, Sn, P, As, or Sb.

41. The method of claim 39 wherein said catalytic element is selected from VIII group elements, IIIb, IVb, and Vb elements.

42. The method of claim 39, further comprising the step of patterning the crystallized silicon film to form at least a channel region of a thin-film transistor.

43. The method according to claim 39, wherein said energy is a light or a heat.

* * * * *